United States Patent [19]
Tosto

[11] 3,943,459
[45] Mar. 9, 1976

[54] TUNING SYSTEM FOR A MICROWAVE LOCAL OSCILLATOR

[75] Inventor: Paul S. Tosto, Woodbury, N.Y.

[73] Assignee: Cutler-Hammer, Inc., Milwaukee, Wis.

[22] Filed: Apr. 2, 1975

[21] Appl. No.: 564,430

[52] U.S. Cl. .................. 331/4; 331/16; 331/17; 331/107 G; 331/175; 331/176
[51] Int. Cl.² .................................. H03B 3/04
[58] Field of Search ............ 331/4, 17, 16, 18, 10, 331/107 G, 175, 176

[56] References Cited
UNITED STATES PATENTS

| | | | |
|---|---|---|---|
| 3,764,933 | 10/1973 | Fletcher | 331/4 |
| 3,793,594 | 2/1974 | Griswold | 331/4 |

*Primary Examiner*—John Kominski
*Attorney, Agent, or Firm*—Henry Huff; Kevin Redmond

[57] ABSTRACT

A variable frequency voltage controlled oscillator is tuned to a selected frequency by applying a varying voltage to the control port of the oscillator to sweep the oscillator signal through a frequency range which includes the frequency of a reference frequency source. The value of the varying voltage is stored at the instant the oscillator frequency coincides with the frequency of the reference source. A dc offset voltage is then added to the stored voltage to produce a sum voltage which is substituted for the varying voltage at the control port of the oscillator to tune the oscillator to the selected frequency. The offset voltage is equal to the difference in the control voltages at the selected and reference frequencies and may be determined from the oscillator control voltage characteristic.

The oscillator can be set reliably to a selected frequency without using temperature compensation, provided that, at each frequency in a range of interest, the rate of change $df/dv$ of the oscillator frequency with respect to the change in control voltage is constant despite changes in temperature.

13 Claims, 4 Drawing Figures

TUNING SYSTEM FOR A MICROWAVE LOCAL OSCILLATOR

BACKGROUND

1. Field of the Invention

This invention pertains to systems for tuning a variable frequency oscillator and more particularly to systems for accurately tuning a microwave local oscillator to any one of a plurality of selected frequencies using only a single reference frequency source.

2. Prior Art

The local oscillator in a microwave receiver usually includes a crystal controlled oscillator and a frequency multiplier. The crystal oscillator generates a signal at a precisely controlled frequency and the multiplier converts the relatively low frequency signal from the oscillator to a desired microwave frequency. In one type of conventional multichannel receiver, a separate crystal oscillator and multiplier are required for each RF channel, appreciably affecting the receiver's cost and volume. In another type of receiver, a single variable frequency microwave oscillator is tuned to all the local oscillator frequencies; however, additional costly components such as a synthesizer or multiple reference sources are generally necessary to obtain precise frequency control.

SUMMARY

In the present invention, the precise frequency control required of a local oscillator in a microwave receiver is achieved with a voltage controlled variable frequency oscillator and only one reference frequency source. The principal requirement of an oscillator for use in this invention is that, at each frequency within a range of interest, the rate of change $df/dv$ of the oscillator frequency with respect to the change in control voltage must remain constant, despite changes in environmental conditions. This requirement, which will be referred to hereinafter as simply a requirement for a constant slope at each frequency, can be realized with either linear or nonlinear control characteristics. Each of the varactor tuned Gunn oscillators from the number evaluated for use in experimental models of the invention, exhibited a control characteristic which was generally nonlinear, but which met this requirement over a significant portion of its frequency range.

In the operation of an elementary system incorporating the invention, a varying voltage is applied to the control port of the variable frequency oscillator, sweeping it over a frequency range that includes the frequency of a reference frequency source. When the frequency of the oscillator coincides with the reference frequency, the instantaneous value of the varying voltage is stored. The oscillator is then set to the selected frequency by adding a dc offset voltage to the stored voltage to produce a sum voltage which is substituted for the varying voltage at the control port of the oscillator.

The offset voltage may be determined from a graph of the oscillator control characteristic. In a simple case, where the oscillator characteristic is essentially linear, the offset voltage is equal to the produce of the reciprocal of the slope of the control characteristic curve $df/dv$ and the difference between the selected and reference frequencies. In all cases, even when the characteristic is nonlinear, the offset voltage for a particular selected frequency and a particular reference frequency must be constant, regardless of changes in temperature.

The use of a constant offset voltage that is independent of temperature reduces the complexity of the receiving system by eliminating the need for temperature compensation for the oscillator. A simple voltage divider may be used to produce a number of offset voltages. The receiver is tuned to a selected frequency by merely switching the appropriate offset voltage from the divider to a summing network. The offset voltage is added to the stored voltage in the summing network to produce the required oscillator control voltage for the selected frequency.

DRAWING

DETAILED DESCRIPTION

The principles of operation of the present invention are described with reference to FIGS. 1 and 2. In these Figures, temperature has been chosen to illustrate the effect of a change in an environmental parameter on the control characteristic of an oscillator. This invention is capable of operating satisfactorily with a change in any environmental parameter, provided the corresponding changes in the control characteristic meet requirements which will be described in the following paragraphs.

Figure 1:
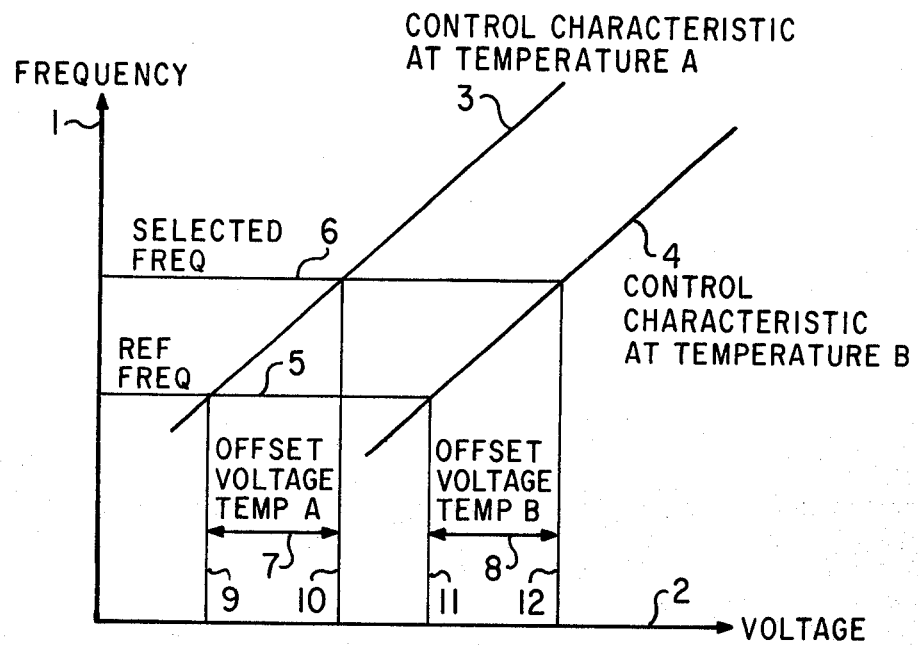
FIG. 1 is a graph of a linear frequency control voltage characteristic of a voltage controlled oscillator.

Referring to FIG. 1, an ordinate 1 and an abscissa 2 are the frequency and voltage axes, respectively, of a graph of a linear control characteristic. The oscillator control characteristics at two temperatures, A and B, are represented by curves 3 and 4. A reference and a selected frequency, arbitrarily chosen for illustrative purposes, are shown as horizontal lines 5 and 6. The control voltages to set the oscillator to the reference and selected frequencies are represented by vertical lines 9 and 10 for temperature A and by lines 11 and 12 for temperature B. The change in control voltage to tune the oscillator from the reference frequency to the selected frequency is represented by a voltage 7 for temperature A and by a voltage 8 for temperature B.

The control voltages to set the oscillator to the reference and selected frequencies are referred to herein as the reference frequency control voltage and selected frequency control voltage. The difference between these voltages is referred to as the offset voltage.

The slope $df/dv$ of the frequency control characteristic graph shown in FIG. 1 is constant throughout the curve and remains constant when the oscillator is exposed to a change in temperature. Observe that curves 3 and 4 comprise a first set of linear, parallel lines. The reference and selected frequency lines 5 and 6 comprise a second set of parallel lines that intersect the first set. By projecting each point of intersection of these two sets of parallel lines on the voltage axis 2, two equal offset voltages, 7 and 8, are defined. The offset voltages at different temperatures for a particular selected frequency and reference frequency will always be equal for this type of control characteristic. This is illustrated by the fact that the line segments delineated by two sets of intersecting parallel lines are equal, and the projections of these equal line segments on an axis of a rectangular coordinate system are also equal.

In the operation of a system incorporating this invention, only one offset voltage is used to set the oscillator to a particular selected frequency. For a system to operate in this manner, the offset voltage for a particular set of selected and reference frequencies must remain constant regardless of changes in environmental conditions. As can be seen from FIG. 1, this requirement is met by oscillators that exhibit a linear control characteristic that retains a constant slope $df/dv$ despite changes in environmental conditions.

In a fundamental system incorporating an oscillator with control characteristic curves similar to the linear, parallel curves shown in FIG. 1, the oscillator is first set to a reference frequency and then an offset voltage is added to the reference control voltage to produce a sum voltage which sets the oscillator to the selected frequency. The offset voltage is equal to the product of the reciprocal of the slope $df/dv$ and the difference between the reference and selected frequencies. The frequency difference is positive when the selected frequency is greater than the reference frequency and negative when the reverse is true.

Figure 2:
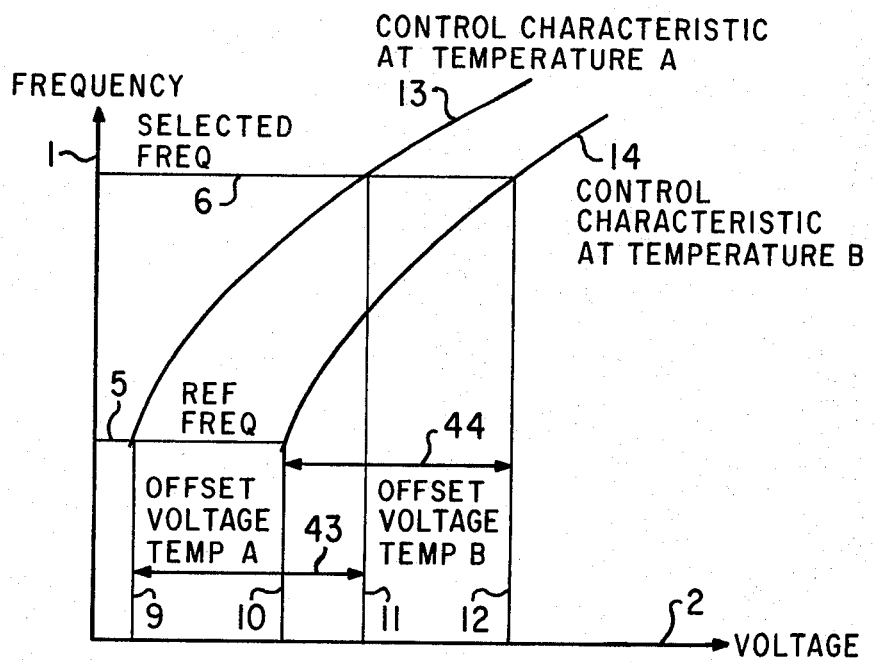
FIG. 2 is a graph of a nonlinear frequency control voltage characteristic of a voltage controlled oscillator.

Referring to FIG. 2, two identically shaped nonlinear control characteristic curves 13 and 14 at temperatures A and B are shown displaced from one another in the direction of the voltage axis. Although the nonlinearity of these two curves makes them appear to converge on the right-hand side of the Figure, the displacement between them in the direction of the voltage axis 2 is constant. The projection of the intersections of the reference and selected frequency lines 5 and 6 with the curves 13 and 14 again produces two offset voltages 43 and 44 that are identical in value. The two offset voltages are identical because the right-hand curve is produced by displacing the left-hand curve in the horizontal direction and the horizontal frequency lines intersect the two curves at points which are at the same relative locations on each curve. From FIG. 2, it can be observed that the offset voltage for particular reference and selected frequencies will remain constant for an oscillator with a nonlinear control characteristic if each point on the characteristic curve is shifted by an equal amount in the direction of the voltage axis. Note that at each frequency, the slope $df/dv$ remains constant for both the linear curves in FIG. 1 and the nonlinear curves in FIG. 2. An oscillator with a nonlinear control characteristic of the type shown in FIG. 2 meets the requirement for a constant offset voltage and can be tuned to a selected frequency by the same steps used to tune an oscillator with linear characteristics.

Figure 3:
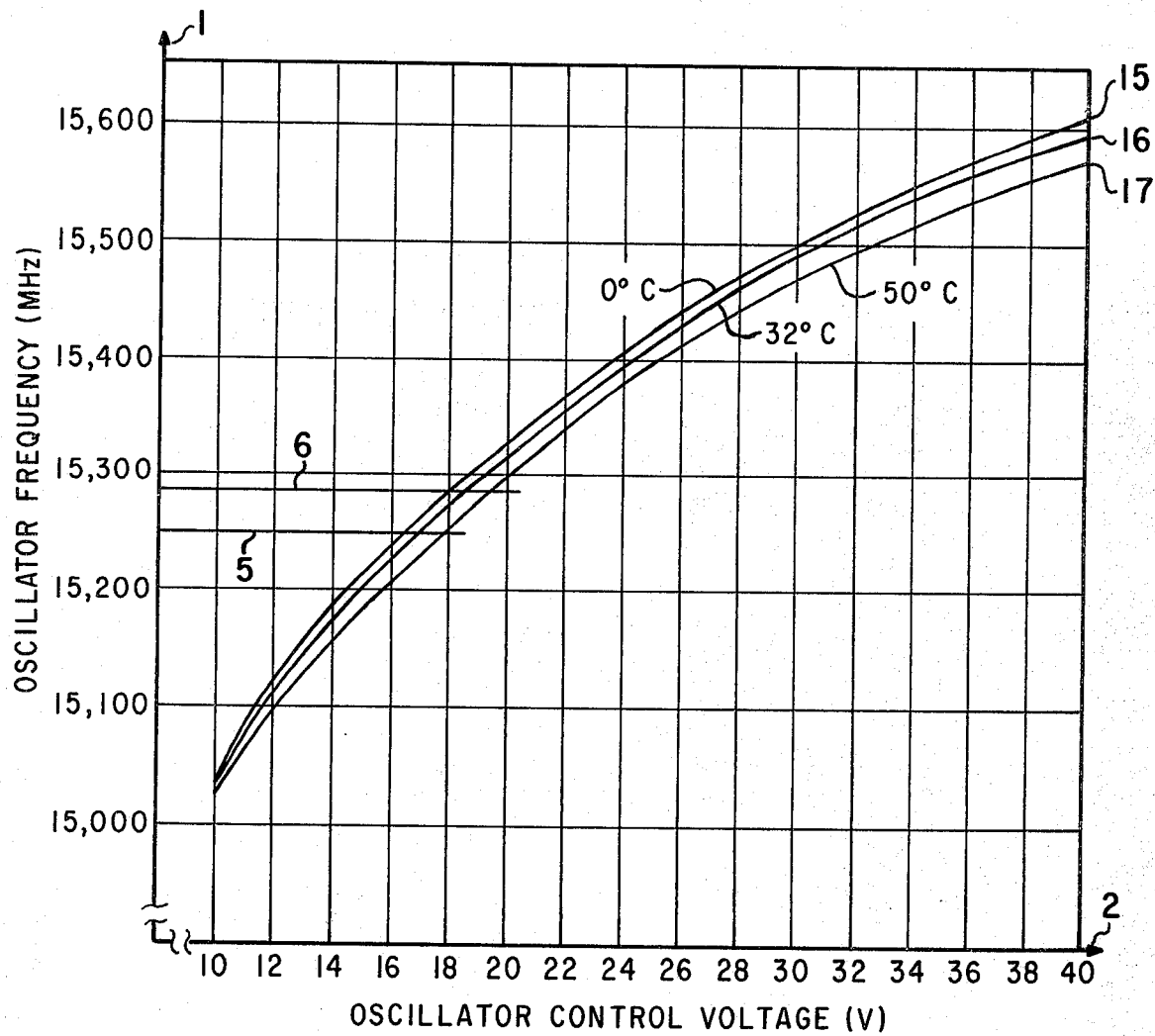
FIG. 3 is a graph of a frequency control voltage characteristic of a varactor tuned Gunn oscillator.

Referring to FIG. 3, curves 15, 16 and 17 are the control characteristic curves of a varactor tuned Gunn oscillator at 0°C, 30°C and 50°C. These curves, when considered in their entirety, do not appear to be linear, parallel or equally displaced from one another in the direction of the voltage axis, nor do they have a slope that is constant at each frequency regardless of changes in environmental conditions; however, they do exhibit each of these characteristics to a reasonable approximation over limited frequency ranges. For example, over the range of 15,250 MHz to 15,285 MHz, the curves are essentially linear and parallel. Over a wider frequency range, such as 15,250 MHz, to 15,450 MHz, these curves are essentially identical and displaced from one another by a constant voltage. Therefore, a constant offset voltage may be computed from these characteristic curves over these frequency ranges to tune the oscillator from a particular reference frequency to a particular selected frequency.

Figure 4:
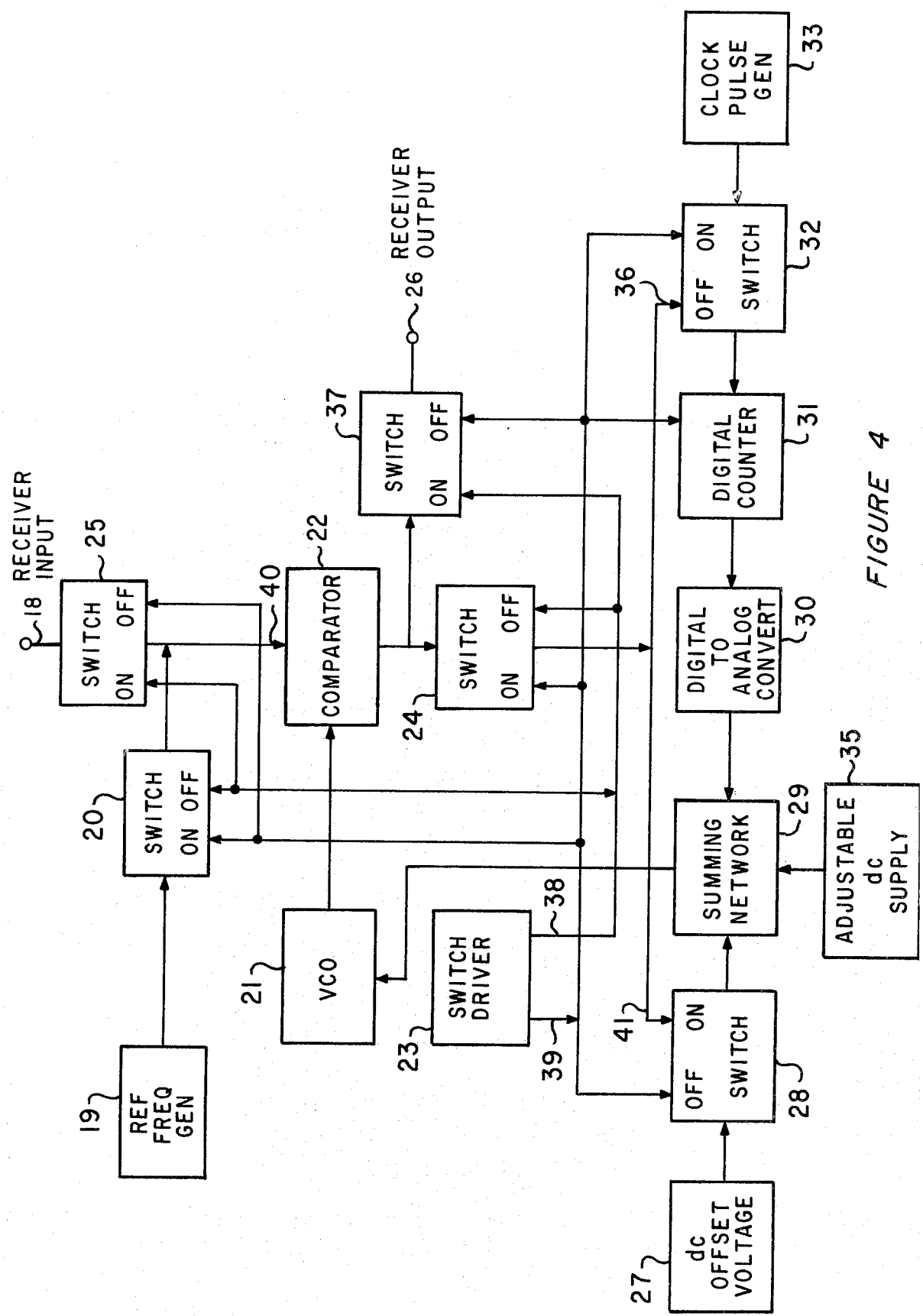
FIG. 4 is a block diagram of a preferred embodiment of the invention.

Referring to FIG. 4, the invention is shown in a practical application, functioning as the local oscillator in a superheterodyne receiver. All of the superheterodyne circuitry, with the exception of the local oscillator, is contained in a device herein referred to as a comparator. The comparator serves a dual purpose. It functions as a receiver in one mode of operation and as a frequency comparator in a second mode of operation.

The principal elements of the invention, as shown in the application illustrated in FIG. 4, include a voltage controlled oscillator 21, a reference frequency generator 19, a frequency comparator 22, a source of a dc offset voltage 27, a voltage summing network 29, and a source of varying voltage comprising a clock pulse generator 33, a digital counter 31, and a digital to analog converter 30.

In this system, the varying voltage is stored by cutting off the clock pulse signal to the digital counter; however, the storage function may be carried out apart from the generation of the varying voltage in a separate device such as a sample-and-hold circuit.

The remaining circuitry includes an adjustable voltage supply 35, switches 20, 24, 25, 28, 32 and 37, and a switch driver 23. The switch driver 23 is a pulse generator with two output ports, 38 and 39. The outputs from these ports are control signals which are transmitted to a number of the switch control ports to transfer the receiver operation from a reception mode to an oscillator calibration mode. The switch driver may be designed to produce pulses alternately from each output to continuously recalibrate the oscillator, or the reception and calibration periods may be adjusted as necessary to meet the requirements of a particular application.

All of the switches are controlled either by the pulses from the switch driver 23 or a pulse from the output of comparator 22. A pulse from the driver port 38 switches the receiver to the reception mode. This pulse closes switches 25 and 37, connecting the comparator input and output ports 40 and 42 to the receiver input and output ports 18 and 26, respectively. This pulse also opens switches 20 and 24, disconnecting the comparator input port 40 from the reference frequency generator 19 and the comparator output port 42 from the control ports 41 and 36 of switches 28 and 32.

In the reception mode, a received signal at the input port 18 passes through the switch 25, the comparator 22 and the switch 37 to the receiver output port 26. The comparator is a superheterodyne circuit that includes a mixer, IF amplifier and detector. The local oscillator signal for the superheterodyne circuit is supplied by the voltage controlled oscillator 21.

A pulse from the driver output port 30 switches the receiver to the calibrate mode. This pulse closes switches 20, 24 and 32 and opens switches 25, 28 and 37. With the switches in these positions, the comparator is disconnected from the receiver input and output ports 18 and 26 respectively, and connected to the reference frequency generator 19 and the control ports 41 and 36 of the switches 28 and 32.

In the calibration mode, the output of the clock pulse generator 33 passes through the switch 32 to the digital counter 31. The output of the counter is supplied to the digital to analog converter 30 to produce a varying voltage which is supplied through summing network 29 to the control port of the voltage controlled oscillator 21, sweeping the oscillator over a frequency range determined by the magnitude of the varying voltage.

A signal from reference frequency generator 19 passes through switch 20 to the comparator 22 where it mixes with the swept local oscillator signal. The swept local oscillator signal generates a swept IF signal which produces an output from the comparator only when the IF signal falls within the passband of the IF amplifier in the comparator. The frequency range over which the comparator responds can be reduced to less than the bandwidth of the IF amplifier by including a peak detector at the output of the amplifier. The peak detector produces an output only when the signal is at the comparator's frequency of maximum gain.

The comparator output is a pulse supplied through the switch 24 to the switch 32 as a control signal which opens the switch 32, cutting off the clock pulse input to the digital counter 31. The counter and digital to analog converter outputs remain at the values produced by the pulse immediately preceding the comparator output pulse, thereby storing the instantaneous value of the varying voltage at the time the local oscillator signal from the oscillator 21 tunes the comparator to the frequency of the reference generator.

The comparator output pulse is also supplied to the switch 28 as a control signal which closes the switch 28, supplying the dc offset voltage from the voltage source 27 to the summing network 29. The offset voltage is added in the summing network to the stored voltage to produce a sum voltage. The sum voltage is substituted for the varying voltage at the control port of the oscillator to tune the oscillator to a selected frequency.

In the fundamental system described above, the oscillator is first adjusted to the frequency of the reference generator. This implies that the comparator IF frequency is zero. To operate at or near zero frequency, the mixer and IF amplifier in the comparator are replaced by equivalent components designed to operate at low frequencies such as a phase detector and a dc coupled video amplifier.

In a system in which the IF frequency is not zero, the oscillator is first adjusted to a local oscillator frequency that tunes the comparator to the frequency of the reference generator. This local oscillator frequency, referred to herein as the secondary reference frequency, is separated from the reference frequency by a difference frequency equal to the IF frequency of the comparator. The secondary reference frequency is ordinarily the only local oscillator frequency at which the comparator produces an output pulse. Image responses are suppressed by any of a number of well known techniques such as preselection, image phasing, and limiting the range of variation of the oscillator control voltage.

In applications where a number of secondary reference frequencies are separated from each other by a constant frequency difference, the system may be designed to eliminate the need for image rejection. This is accomplished by setting the primary reference signals to frequencies midway between the secondary reference frequencies and by setting the IF amplifier in the comparator to a frequency equal to one-half the difference between the secondary reference frequencies. Although a comparator without any means of image rejection receives the adjacent primary reference signals immediately above and below a particular secondary reference signal, no undesired outputs are generated by the comparator. Either one of the adjacent primary reference signal acting alone or both together will produce an output from the comparator only when the oscillator is at a secondary reference frequency. The primary reference signals required for this system design are separated by a constant frequency difference and may be produced conveniently by a comb frequency generator.

Once the oscillator has been set to a secondary reference frequency, it is then shifted to the selected frequency. The selected frequency is the local oscillator frequency required to tune the comparator to a desired reception frequency. This frequency shift is accomplished by adding an offset voltage to the control voltage used to tune the oscillator to the secondary reference frequency. The offset voltage is equal to the difference in the control voltage at the selected frequency and at the secondary reference frequency. The offset voltage may be determined from a graph of the control characteristic.

Greater accuracy may be achieved in setting the oscillator to a selected frequency by reducing the frequency range over which the dc offset voltage is computed from a graph of the oscillator characteristics. Reference signals at a number of frequencies across a band of interest make it possible to reduce the difference between the reference and selected frequencies and thus reduce the degree of dependency on the oscillator characteristics. The reference frequencies may be produced by any convenient means such as a comb frequency generator or multiple reference sources. A number of reference signals may be present at the same time at the local oscillator port of the comparator without interfering with the operation of the system, provided the varying voltage is constrained to sweep the oscillator over a range that includes only one reference frequency signal. This may be carried out by limiting the amplitude of the varying voltage to sweep a range less than the difference between two reference signals and by adding a dc voltage to the varying voltage to set the approximate midpoint about which the oscillator is swept. The added dc voltage, referred to herein as the reference frequency selection voltage, may be obtained from a dc source such as the adjustable voltage supply 35 in FIG. 4. The voltage from this supply is added to the varying voltage in the summing network 29.

A number of reference oscillators or a comb generator may be used to accommodate oscillators with control characteristics which do not exhibit a constant slope at each frequency over wide segments of their frequency range. In effect, the frequency range of the oscillator is divided by the reference signals into segments, each of which approximates the required characteristic. The amplitude of the varying voltage and the reference frequency selection voltage are adjusted to sweep the oscillator through a segment which contains a desired secondary reference frequency. The oscillator is then set to the secondary reference frequency and to the selected frequency within the segment in accordance with the normal operation of the invention.

I claim:

1. Apparatus for generating a signal at a selected frequency, comprising:
   a. a voltage controlled oscillator having, at each frequency in a range of interest, a rate of change $df/dv$ of frequency with respect to a change in control voltage that is constant despite changes in environmental conditions,
b. means for generating a primary reference frequency signal,
c. means for generating a varying control voltage to sweep the tuning of said oscillator through a first frequency range which includes a secondary reference frequency that differs from said primary reference frequency by a specified difference frequency,
d. means for applying said varying control voltage to the control port of the oscillator,
e. means for comparing the primary reference signal with the oscillator signal to produce an output pulse when the two differ by said specified difference frequency and said oscillator is at said secondary reference frequency,
f. means responsive to said output pulse to store the instantaneous value of said varying voltage,
g. means for producing a dc offset voltage equal to the difference in the control voltage at said secondary reference frequency and at said selected frequency,
h. a voltage summing network to add the stored voltage and the offset voltage to produce a sum voltage, and
i. means for substituting said sum voltage for said varying voltage at the control port of the oscillator.

2. Apparatus as claimed in claim 1, wherein the specified difference frequency is zero.

3. Apparatus as claimed in claim 1, wherein said control voltage characteristic is nonlinear and is shifted by the same voltage at all frequencies in a range of interest when the oscillator is subject to a change in environmental conditions.

4. Apparatus as claimed in claim 1, wherein said frequency control voltage characteristic is essentially linear and said characteristic is subject to variation with changes in environmental conditions, but retains a constant slope $df/dv$ throughout a frequency range of interest, and said offset voltage is equal to the product of the reciprocal of said constant slope $df/dv$ and the difference between said selected frequency and said secondary reference frequency.

5. Apparatus as claimed in claim 1, wherein said means for comparing comprises:
a. a superheterodyne circuit,
b. means for applying the reference frequency signal to the RF input port of said superheterodyne circuit, and
c. means for applying the oscillator signal to the local oscillator port of said superheterodyne circuit to sweep the RF tuning of said circuit through a second frequency range that includes the reference frequency signal, and to produce an output pulse from said circuit when the reference signal and oscillator signal have a frequency difference equal to the IF frequency of said circuit and the oscillator is at said secondary reference frequency.

6. Apparatus as claimed in claim 5, wherein the voltage controlled oscillator is a varactor tuned Gunn oscillator.

7. Apparatus as claimed in claim 6, wherein said means for producing said varying voltage comprises a clock pulse generator, a digital counter for counting the pulses from said clock generator, and a digital to analog converter for converting the output of said counter to an analog voltage.

8. Apparatus as claimed in claim 7, wherein said means to store the control voltage includes means responsive to said output pulse to cut off the clock pulse input to the counter, whereby the outputs of said counter and said digital to analog converter remain at the values produced by the clock pulse immediately preceding said output pulse.

9. Apparatus as claimed in claim 8, wherein said means for producing a reference frequency signal includes a comb generator which produces a plurality of discrete comb frequency signals.

10. Apparatus as claimed in claim 9, wherein a plurality of secondary reference frequencies are separated from each other by a constant frequency difference, said plurality of discrete comb frequencies are separated by said constant frequency difference and each is displaced from a secondary reference frequency by one-half said constant frequency difference, and the IF frequency of said comparator is equal to one-half said constant frequency difference.

11. Apparatus as claimed in claim 9, further comprising:
a. means for limiting the range of variation of said varying voltage to limit said second frequency range to less than the frequency difference between the closest discrete comb frequencies,
b. means for producing a dc reference frequency selection voltage,
c. means for applying said reference frequency selection voltage to said voltage summing network to produce a combined control voltage comprising the varying voltage and the reference frequency selection voltage, and
d. means for adjusting said reference selection voltage to sweep said superheterodyne circuit through a selected one only of said discrete comb frequencies.

12. A method for tuning a voltage controlled oscillator to a selected frequency, said oscillator having at each frequency in a frequency range of interest a rate of change $df/dv$ of frequency with respect to the change in voltage that is constant despite changes in environmental conditions, comprising the steps of:
a. generating a primary reference frequency signal,
b. generating a varying control voltage to sweep the tuning of said oscillator through a frequency range which includes a secondary reference frequency that differs from said primary reference frequency by a specified difference frequency,
c. applying the varying voltage to the control port of the oscillator,
d. comparing the frequency of the reference signal with that of the oscillator to produce an output pulse when the two differ by said specified difference frequency and said oscillator is at said secondary reference frequency,
e. storing the instantaneous value of said varying voltage in response to said output pulse,
f. producing a dc offset voltage equal to the difference in the control voltage at said secondary reference frequency and at said selected frequency,
g. adding the stored and the offset voltages to produce a sum voltage, and
h. substituting said sum voltage for said varying voltage at the control port of the oscillator.

13. A method as claimed in claim 12, further comprising the steps of:

a. periodically removing the sum voltage from the oscillator control port and reapplying said varying voltage to said port,
b. recomparing the frequency of the oscillator to the primary reference frequency to correct the stored voltage for changes in the frequency control voltage characteristic of the oscillator caused by changes in environmental conditions,
c. adding the offset voltage and the corrected stored voltage to produce a corrected sum voltage, and
d. substituting the corrected sum voltage for the varying voltage at the control port of the oscillator.

* * * * *